US008253495B2

(12) United States Patent
    Bouisse

(10) Patent No.: US 8,253,495 B2
(45) Date of Patent: Aug. 28, 2012

(54) WIRELESS COMMUNICATION DEVICE AND SEMICONDUCTOR PACKAGE DEVICE HAVING A POWER AMPLIFIER THEREFOR

(75) Inventor: Gerard Bouisse, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/120,707

(22) PCT Filed: Sep. 30, 2008

(86) PCT No.: PCT/IB2008/055635
    § 371 (c)(1),
    (2), (4) Date: Mar. 24, 2011

(87) PCT Pub. No.: WO2010/038111
    PCT Pub. Date: Apr. 8, 2010

(65) Prior Publication Data
    US 2011/0175680 A1    Jul. 21, 2011

(51) Int. Cl.
    *H03F 3/68*    (2006.01)
(52) U.S. Cl. .................... 330/295; 330/124 R
(58) Field of Classification Search .......... 330/295, 330/124 R, 286
    See application file for complete search history.

(56) References Cited

U.S. PATENT DOCUMENTS

| 5,420,541 | A  | * | 5/1995  | Upton et al. ............ 330/286 |
| 6,281,756 | B1 |   | 8/2001  | Goto et al. |
| 6,922,106 | B2 | * | 7/2005  | Lautzenhiser et al. ..... 330/295 |
| 7,170,353 | B2 | * | 1/2007  | Amano ................... 330/295 |
| 2002/0097096 | A1 |   | 7/2002 | Brandt |
| 2010/0301947 | A1 | * | 12/2010 | Fujioka et al. ........... 330/295 |

FOREIGN PATENT DOCUMENTS

EP    1202446 A2    5/2002

OTHER PUBLICATIONS

International Search Report and Written Opinion correlating to PCT/IB2008/055635 dated Jun. 29, 2009.

* cited by examiner

*Primary Examiner* — Henry Choe

(57) ABSTRACT

A semiconductor package device comprises a first amplifier block, at least one further amplifier block operably coupled in parallel with the first amplifier block between a common input and a common output, and at least one stabilization network operably coupled between a node of the first amplifier block and a corresponding node of the at least one further amplifier block. The at least one stabilization network comprises an inductance operably coupled between the corresponding nodes of the first and at least one further amplifier blocks, and a capacitance operably coupling a mid-point of the inductance to a ground plane.

20 Claims, 7 Drawing Sheets

US 8,253,495 B2

WIRELESS COMMUNICATION DEVICE AND SEMICONDUCTOR PACKAGE DEVICE HAVING A POWER AMPLIFIER THEREFOR

FIELD OF THE INVENTION

The field of this invention relates to radio frequency (RF) power amplifiers (PAs) and semiconductor package device therefor. The invention is applicable to, but not limited to, a semiconductor package device comprising two or more amplifier blocks.

BACKGROUND OF THE INVENTION

In the field of wireless communication, for many applications, such as within a cellular radio infrastructure, medical and/or industrial applications, etc, radio frequency (RF) power amplifiers (PAs) are required to supply an increasing amount of output power. In order for RF PAs to achieve such an increasing power capacity demand, it is necessary to use several individual die blocks in a parallel structure. This necessity is primarily due to the aspect ratio of RF transistors (namely their high length to width ratio) as well as mounting technology limitations.

A problem encountered when two or more die blocks are arranged in parallel is that the devices are often prone to odd mode current instabilities. At high operating frequencies, for example in an operating region of 2 GHz, the die size becomes significant compared to the wavelength of the operating frequency, leading to the creation of unbalanced phase combinations between both the parallel die blocks and RF PA loops which, with the presence of any noise at the input of the amplifier (transistor), may lead to oscillations.

FIG. 1 illustrates schematically an example of an RF PA circuit 100 comprising a first power amplifier block 110 and a second power amplifier block 120 operably coupled in parallel as is known in the art, for example as may be used within RF integrated circuits (RFICs). Each power amplifier block 110, 120 comprises an input matching circuit 130, 140 operably coupling an RF input signal 105 to a respective single-ended RF PA transistor 112, 122. In this context, the term 'single-ended' refers to a common mode amplifier and not a differential mode, such as a push-pull amplifier. An output of the drain port of each RF PA transistor 112, 122 is operably coupled to an output matching circuit 150, 160 to attempt achieving a maximum power transfer of the RF PA transistors 112, 122.

As shown, signals present at the input 105 of the RF PA circuit 100 are able to follow two different paths to an output 170 of the RF PA circuit 100, as illustrated in the equivalent circuit of FIG. 2 as Path 'A' 210 and Path 'B' 220. Typically, these two paths 210, 220 indicate how both signals and noise can be combined or cancelled within the RF PA circuit 100. For example, at a particular frequency and if Path 'A' 210 and Path 'B' 220 are phase matched, common mode noise at the input of the RF PA circuit 100 will be combined at the output of the RF PA circuit 100, whereas differential mode noise at the input of the RF PA circuit 100 will be cancelled at the output of the RF PA circuit 100. However, due to the physical sizes of the RF PA devices, for example for devices that are required to support a 100 W output power, it is extremely unlikely that both paths will be phase matched. Furthermore, at a particular frequency, and if Path 'A' 210 and Path 'B' 220 are phase mis-matched by 180 degrees, common mode noise at the input of the RF PA circuit 100 will be cancelled at the output of the RF PA circuit 100, whereas differential mode noise at the input of the RF PA circuit 100 will be combined at the output of the RF PA circuit 100. It is desirable to avoid the combination of differential mode noise in such situations, which may cause reflections that in turn produce oscillations and instabilities within the RF PA circuit 100.

FIG. 3 illustrates a common technique for removing such instabilities within an RF PA circuit 300, in particular a technique employed within RFICs. The drain ports 314, 324 of the RF PA transistors 312, 322 are interconnected to one another via a resistor 310. The interconnection of the drains using resistors in this manner modifies (in a lossy manner) the differential odd mode currents that are intrinsic to any common mode amplifier, and substantially removes much of the related current instabilities mentioned above. The gates (inputs) 316, 326 of the RF PA transistors 312, 322 may also be interconnected to one another via a resistor (not shown) in a similar manner.

Although resistors are generally simple to implement within integrated circuits, in the case of RF PA integrated circuits, the use of resistors to interconnect the drains and gates of the power transistors requires an additional component technology, namely in the form of resistor component technology, requiring a significant amount of additional space and manufacturing complexity.

A known alternative solution to the problem of common mode instabilities mentioned above is to interconnect the drains and gates of the power transistors using inductors, or simply wires, in place of the resistors. The purpose of the inductors is to homogenize the differential odd-mode currents between the transistor blocks, stabilising the odd-mode currents without the need for additional component technology (e.g. resistors). However, the use of inductors in this manner is typically only sufficient for removing odd mode current instabilities at some areas of the frequency spectrum, in particular at higher frequencies. In particular, inductors within integrated circuit packages are typically provided by lengths of wire, with the inductive values being controlled by the length and diameter of the wire. Thus, for high power base station PAs, a circuit design able to remove GHz oscillations would require inductors in the 1 nH to 2 nH range with radio frequency capacitors used for decoupling, i.e. 100 pF to 200 pF MOSCAPS. Lowering the frequency of oscillation would typically translate to increasing the value for the inductors and capacitors that are used. The inductance value is limited in these cases due to its wire bonding implementation. Hence, the capacitor value would need to be increased to the μF range, which is unfeasible using current manufacturing technology.

As a result, it is difficult to calibrate inductances without significantly impacting the layout, etc. of components within the IC package. Accordingly, the use of inductors in this manner significantly limits the amount that a power amplifier integrated circuit (PAIL) layout can be tuned. As a result, a particular PAIL is typically only able to provide stability over a limited frequency range.

SUMMARY OF THE INVENTION

The present invention provides a semiconductor package device and a wireless communication device comprising such a semiconductor package device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the invention.

DETAILED DESCRIPTION OF EMBODIMENTS OF THE INVENTION

Examples of the invention will be described with respect to an implementation of a radio frequency (RF) semiconductor package device, for example one that is suitable for use in a wireless communication unit, for example a cellular base station or a wireless communication unit such as a mobile phone. In this manner, examples are described herein with respect to implementing an 80 W base station using laterally diffused metal oxide semiconductor (LDMOS) technology. Examples of the invention will also be described with respect to a semiconductor package device comprising two or more single ended amplifier blocks. However, it is envisaged that amplifier blocks other than single-ended amplifier blocks may be used in other examples. Thus, the term 'amplifier block' used hereinafter may encompass any other amplifier type. IN addition, the term 'power transistor' used hereinafter may encompass any other power amplifier transistor, such as much lower power transistors, for example those suitable for use in mobile phone technology, where the output power may be of the order of, say 1 W. Furthermore, examples of the invention are suitable in non-final PA stages, such as for use in pre-amplifier networks. In addition, examples of the invention may be implemented in any type of RF amplifier device package. Examples of the invention may also be implemented with any type of RF transistor technology, such as Laterally Diffused Metal Oxide Semiconductor (LDMOS), gallium nitride (GaN), bipolar technology, etc.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
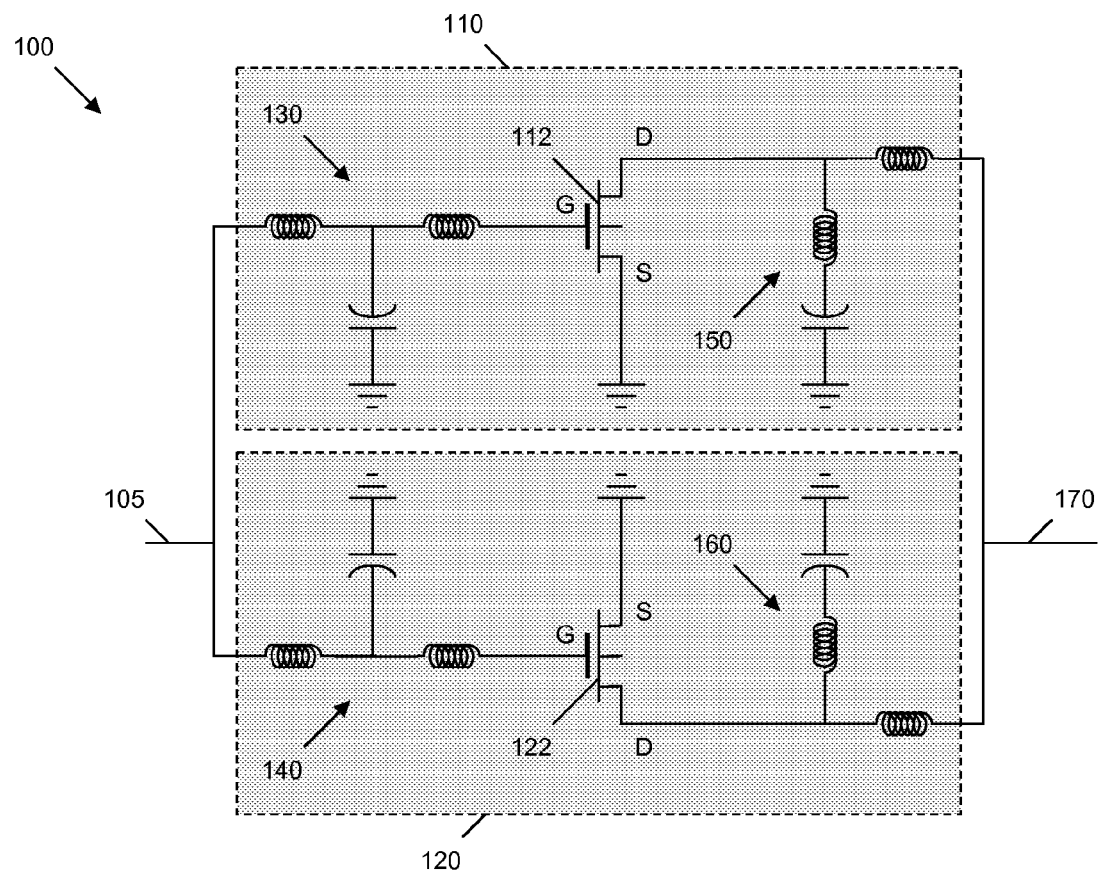
FIG. 1 schematically illustrates an example of an RF PA circuit comprising a first power amplifier block and a second amplifier block operably coupled in parallel, as is known in the art.
Figure 2:
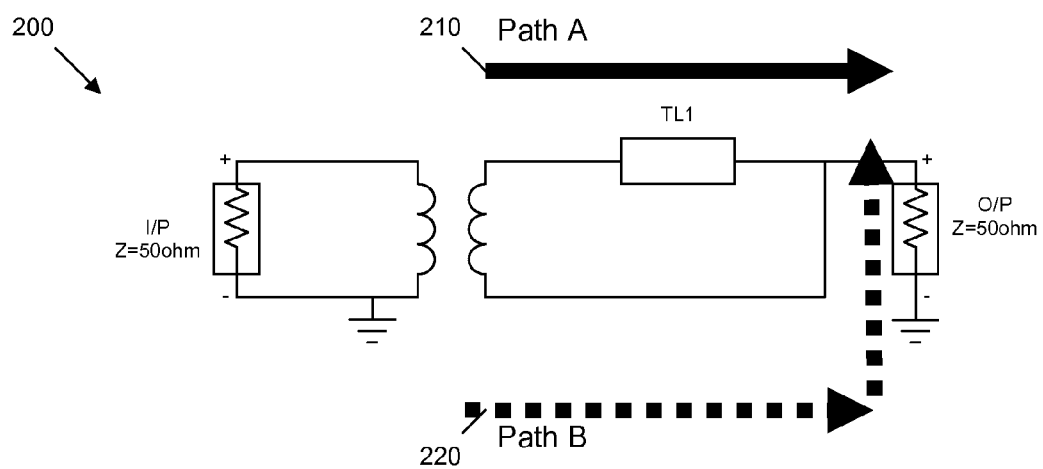
FIG. 2 illustrates an example of an equivalent circuit for the RF PA circuit of FIG. 1.
Figure 3:
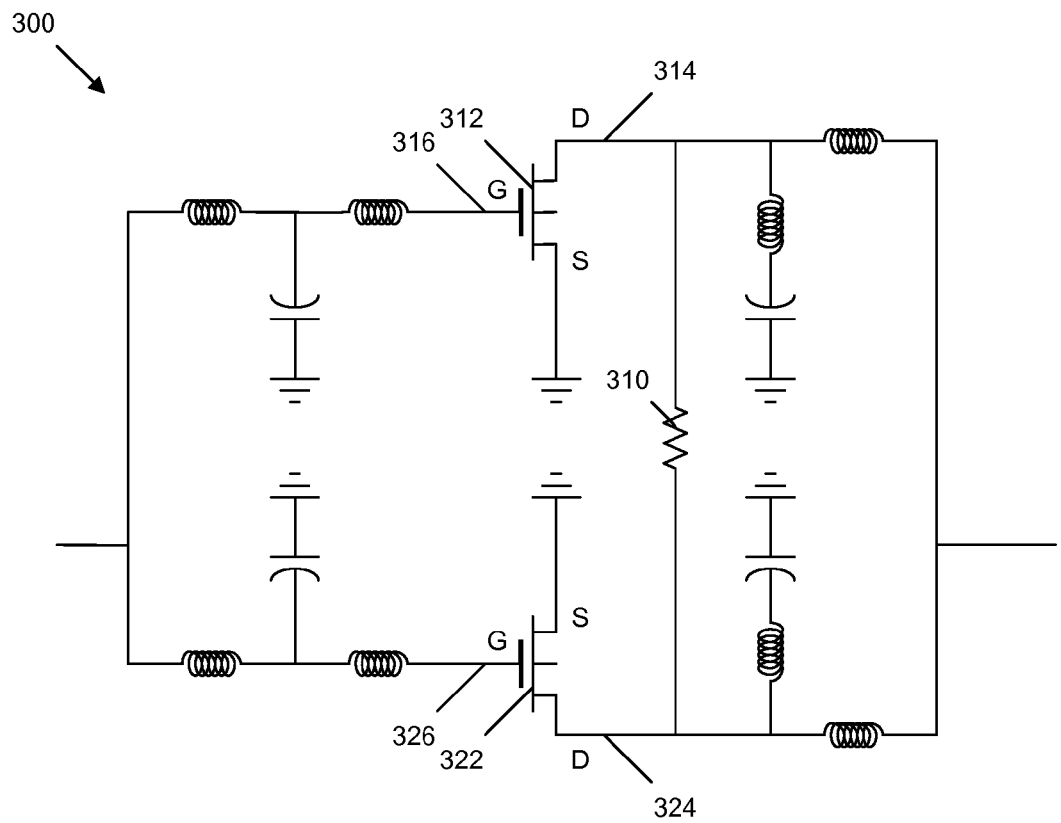
FIG. 3 illustrates a common technique for removing common mode instabilities within an RF PA circuit.
Figure 4:
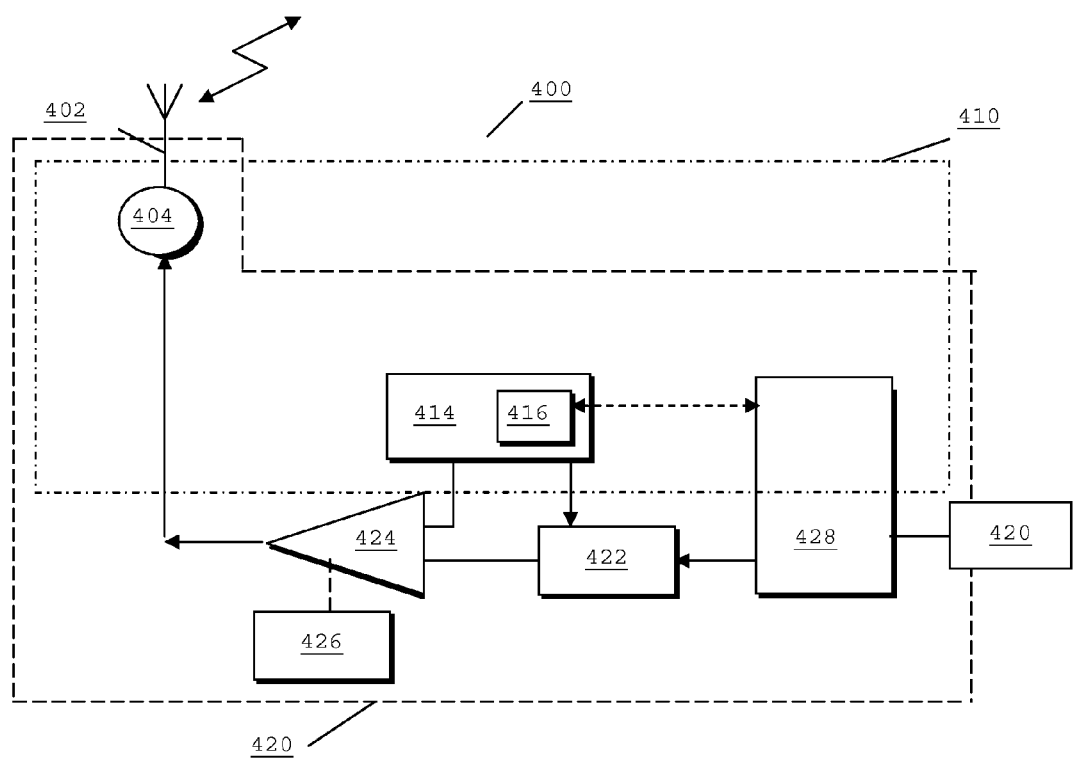
FIG. 4 illustrates an example of a block diagram of a wireless communication unit.

Referring now to FIG. 4, an example of a block diagram of a wireless communication unit 400 is illustrated that is capable of using the RF PAIL. For the sake of clarity, the wireless communication unit 400 is shown as divided into two distinct portions—a receiver chain 410 (which will not be described for clarity purposes only) and a transmitter chain 420. The wireless communication unit 400 contains an antenna coupled to an antenna switch 404 that provides signal control of radio frequency (RF) signals in the wireless communication unit 400, as well as isolation, between the receiver chain 410 and transmit chain 420. Clearly, as understood by a skilled artisan, the antenna switch 404 may be replaced with a duplex filter, for frequency duplex communication units, as known to those skilled in the art.

With regard to the transmit chain 420, this essentially includes a signal processor 428, operably coupled to a modulation and up-converter circuit 422 and power amplifier (PA) module 424. A power source 426 is operably coupled to the PA module 424. The processor 428 and modulation and up-converter circuit 422 are operationally responsive to a controller 414. A timer 418 is operably coupled to the controller 414 to control the timing of operations, namely the transmission or reception of time-dependent signals. The power amplifier module 424 comprises a power amplifier integrated circuit (PAIL) being provided with a voltage source 426 and comprising a plurality of active elements, for example power transistors, and associated RF matching components, as described in greater detail with respect to FIG. 5.

Figure 5:
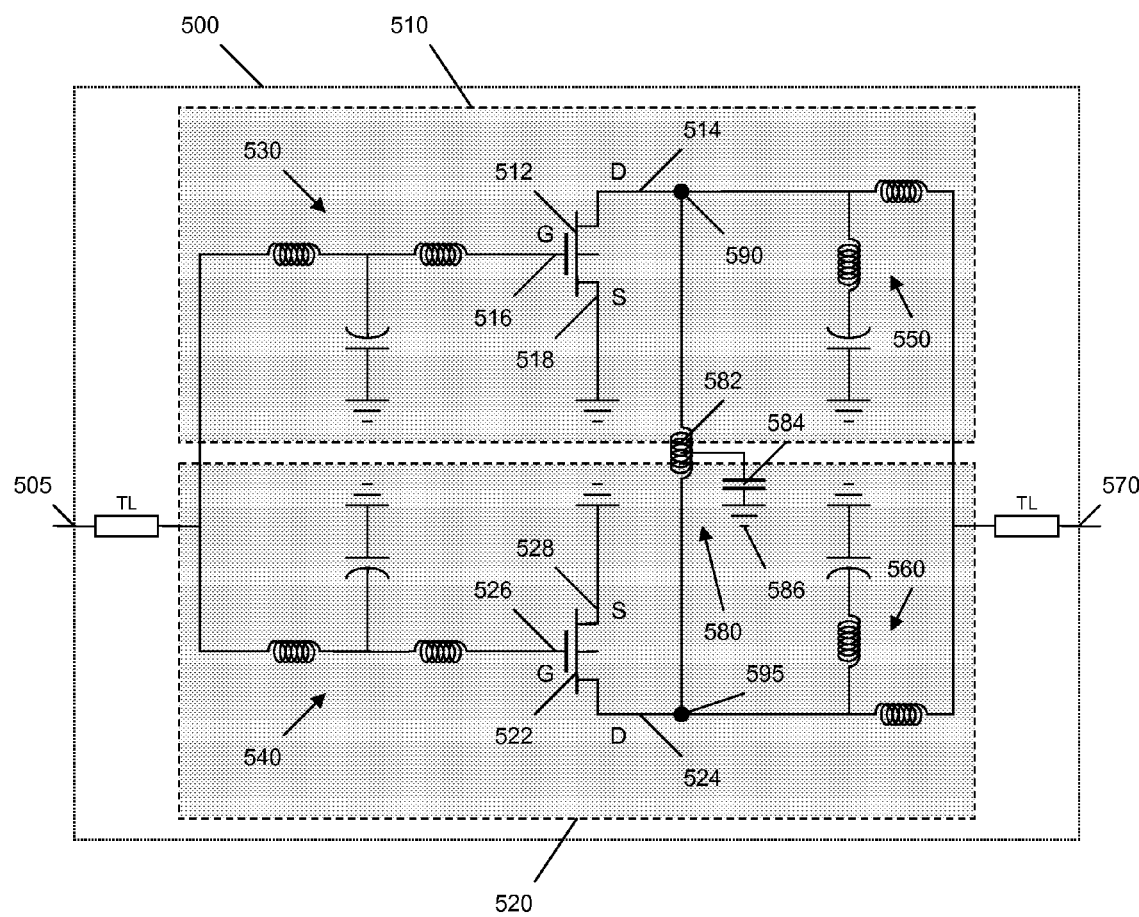
FIG. 5 illustrates an example of a semiconductor package device.

Referring now to FIG. 5 there is illustrated an example of a semiconductor package device 500, for example in a form of a PAIL or the like. The semiconductor package device 500 comprises a first amplifier block 510 and at least one further amplifier block 520 operably coupled in parallel with the first amplifier block 510 between a common input 505 and a common output 570. The exemplary semiconductor package device described herein, and illustrated in the accompanying drawings, comprises only two amplifier blocks for clarity purposes. Further amplifier blocks may also be operably coupled in parallel in further exemplary semiconductor package devices in the same manner.

Each of the first and at least one further amplifier blocks 510, 520 comprises an active element in the form of a respective single ended power transistor 512, 522. In particular for the illustrated example, the active element of each amplifier block 510, 520 comprises a single ended LDMOS power transistor 512, 522 comprising a gate terminal 516, 526 providing an input for the power transistor, a drain terminal 514, 524 providing an output for the power transistor, and a common source terminal 518, 528 operably coupled to ground. The first and at least one further amplifier blocks 510, 520 each further comprise an input matching circuit 530, 540 operably coupled between the common input 505 and the respective input 516, 526 of the power transistor 512, 522, and an output matching circuit 550, 560 operably coupled between the common output 570 and respective the output 514, 524 of the power transistor 512, 522. As previously mentioned, mis-matching, for example at the output 570 of the semiconductor package device 500 can result in incomplete cancellation of unwanted differential noise signals, causing reflections that in turn produce oscillations and instabilities.

Accordingly, the semiconductor package device 500 further comprises at least one stabilisation network 580, operably coupled between a node 590 of the first amplifier block 510 and a corresponding node 595 of the at least one further amplifier block 520. The at least one stabilisation network 580 comprises an inductance 582 operably coupled between the corresponding nodes 590, 595 of the first and at least one further amplifier blocks 510, 520. The stabilisation network 580 further comprises a capacitance 584 operably coupled to a mid-point of the inductance 582 to a ground plane 586. One role of the inductance 582 and capacitor 584 may be to homogenize any differential odd-mode currents between the first and at least one further amplifier block(s) 510, 520.

In this manner, each node 590, 595 is operatively coupled to the ground plane 586 via a series LC circuit. Accordingly, the stabilisation network 580 substantially provides a short circuit between the nodes 590 and the ground plane 586 at frequencies equal to the resonant frequencies of the series LC circuits, thereby enabling currents at those frequencies to be evacuated to ground and thereby providing stabilisation at those frequencies. The values of the inductance 582 and the capacitance 584 may be set such that the resonant frequencies of the series LC circuits provided thereby are substantially equal to a specific frequency band to which the semiconductor package device is expected to be particularly sensitive (e.g. to a frequency at which noise is expected to be received at the common input 505).

Inductors within integrated circuit packages are typically provided by lengths of wire, with the inductive values being controlled by the length and diameter of the wire. As a result, it is difficult to calibrate inductances over a wide range of operating frequencies without significantly impacting the layout, etc. of components within the IC package. However, the capacitance value and characteristics may be more easily tuned, and may be selected such that it provides low frequency and high frequency decoupling of the mid-point of the inductance (namely providing a short circuit at both high frequencies and low frequencies). For example, suitable capacitive values may range from, say, 1 µF to 100 pF (to operate at say 3.8 GHz). It is contemplated that suitable capacitive values may also be as low as RF shortening values of the order of tens of pF (say of the order of 60 pF) to encompass higher operating frequencies, such as the WiMAX frequency at 5.8 GHz. A suitable capacitor can be obtained from AVX Corporation of Myrtle Beach, S.C., USA. Accordingly, the stabilisation network 580 is able to be tuned to provide stability over a wide range of frequencies. Furthermore, no additional component technology is required to provide the stabilisation network, for example in the form of resistor component technology, enabling the special requirements and manufacturing complexity to be kept to a minimum.

It is further contemplated that the capacitance 584 of the stabilisation network 580 may comprise a single wideband capacitor. The single wideband capacitor is able to provide both low frequency de-coupling and high frequency de-coupling based on the following characteristics: the capacitor value of µF range, the rated voltage of, in the present case, 28V, the semiconductor form factor, the grounded electrode location of the semiconductor, a solderability aspect for one electrode noting that one electrode needs to have a metallisation compatible with conventional soldering techniques, such as, for example, AuSi eutectic, and a wire-bondability aspect for the opposite side electrode, namely the electrode connected to the shunt inductance.

In one example, the ground plane 586, to which the capacitance 584 may operatively couple a mid-point of the inductance 582 (+V to −V), such that the mid-point comprises a virtual ground plane in a differential mode amplifier when operating in the desired bandwidth. Thus, undesirable differential mode oscillation is effectively cancelled out at the virtual ground plane (due the inductance mid-point) in a common mode single ended RF PA.

In one example, the at least one further amplifier block may comprise a plurality of further amplifier blocks. Furthermore, in one example, each amplifier block is formed on a single die, to enable consistency between the amplifier blocks. However, in an alternative example, it is envisaged that each amplifier block may be formed on a separate die, due to, say, size, power or heat sink restrictions.

Figure 6:
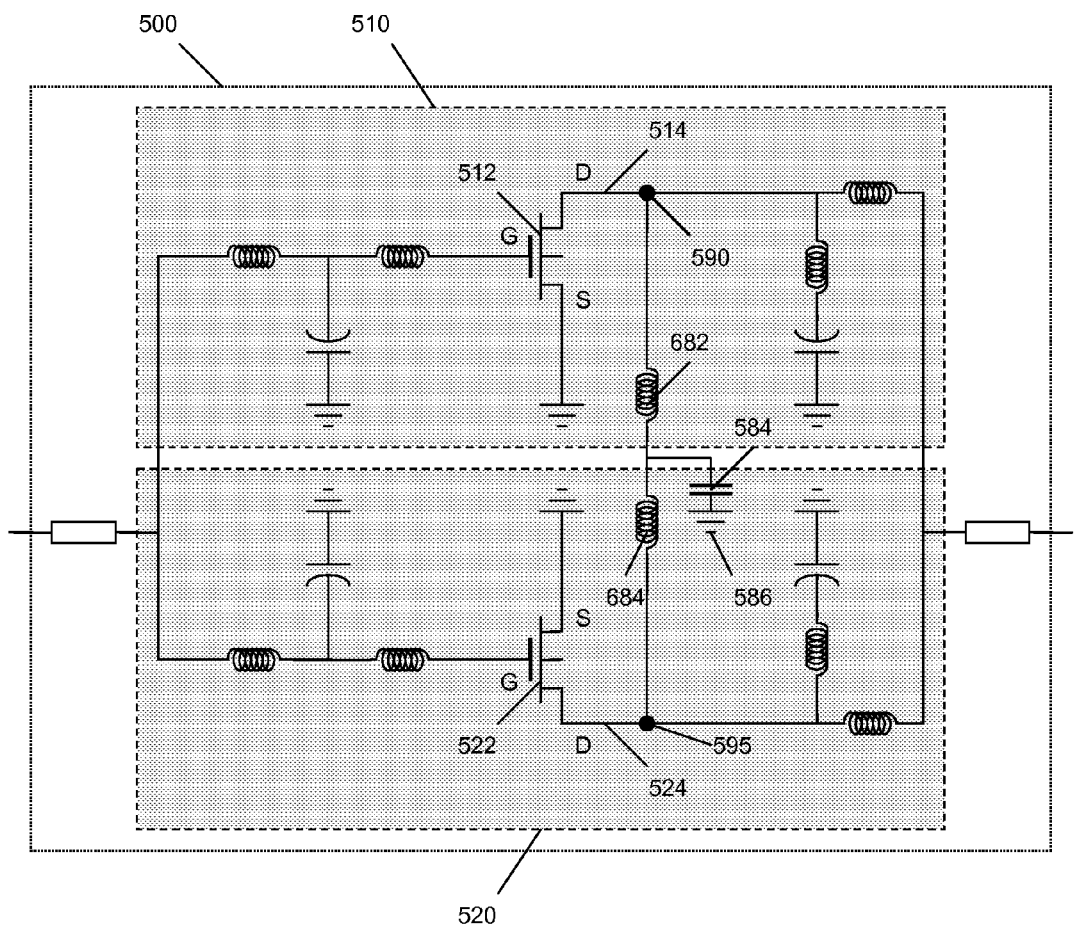
FIG. 6 illustrates a further example of a semiconductor package device.

The inductance is illustrated as a single inductive element 582 in FIG. 5. However, as illustrated in FIG. 6, the inductance may alternatively comprise two (or more) inductive elements 682, 684 coupled in series, with the mid-point thereof to which the capacitance 584 is operably coupled being located between the inductive elements 682, 684. In this manner, a first inductive element 682 is operatively coupled between the first node 590 of the first amplifier block 510 and the capacitance 584, and a second inductive element 684 is operatively coupled between the second node 595 of the at least one further amplifier block 520 and the capacitance 584.

Figure 7:
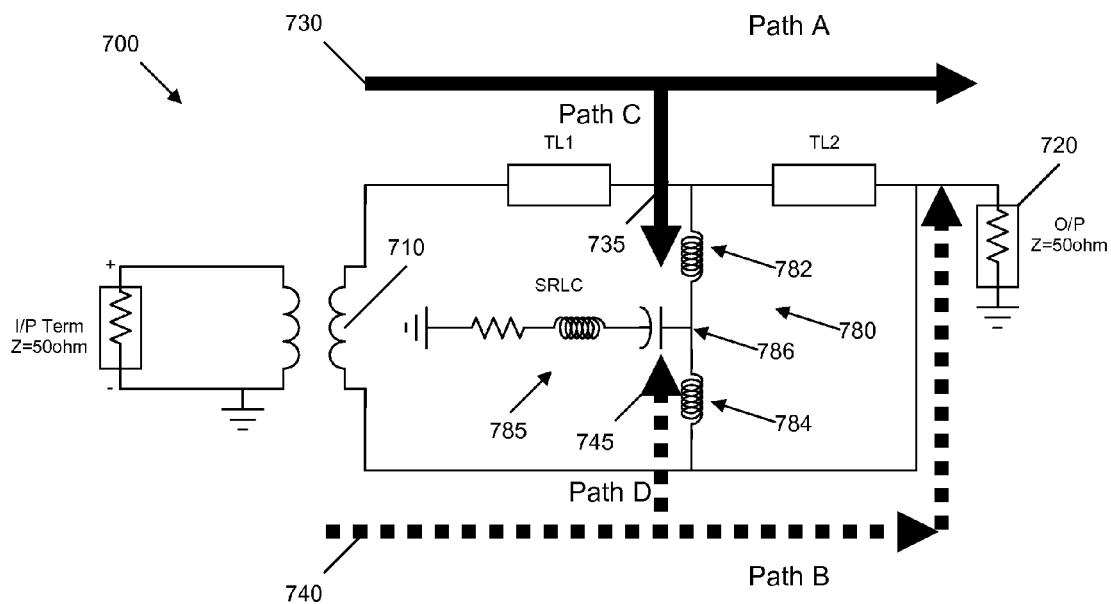
FIG. 7 illustrates an example of an equivalent circuit for the amplifier blocks of FIG. 6.

Referring now to FIG. 7, there is illustrated an example of an equivalent RF PA circuit 700, for example for the amplifier blocks 510, 520 of FIG. 6. As can be seen, signals present at the input 710 of the equivalent RF PA circuit 700 are able to follow two different paths to output 720, illustrated generally as Path 'A' 730 and Path 'B' 740. Typically, these two paths 730, 740 indicate how both signals and noise can be combined or cancelled within the equivalent RF PA circuit 700. For the illustrated example, the stabilisation network 780 is provided between the amplifier blocks and between the two paths Path 'A' 730 and Path 'B' 740. For example, at a particular frequency and if Path 'A' 730 and Path 'B' 740 are phase matched, common mode noise at the input of the RF PA circuit 700 will be combined at the output of the RF PA circuit 700, whereas differential mode noise at the input of the RF PA circuit 700 will be cancelled at the output of the RF PA circuit 700. However, due to the physical sizes of the RF PA devices, for example required to support a 100 W output power, it is extremely unlikely that both paths will be phase matched. Therefore, if Path 'A' 730 and Path 'B' 740 are phase mismatched, say by 180 degrees, differential mode noise at the input of the RF PA circuit 700 will no longer be combined at the output of the RF PA circuit 700, as the differential mode noise follows Path C 735 and Path D 745 respectively. These two paths, Path C 735 and Path D 745, meet at a virtual ground point 786, as shown. The virtual ground point is operatively coupled to a capacitance, for example capacitance 584 of FIG. 5 and FIG. 6, and is represented by an equivalent series RLC circuit 785. As previously mentioned, as the differential mode noise follows Path C 735 and Path D 745, the differential mode noise is cancelled at virtual ground point 786. Thus, the stabilisation network 580 may stabilise any the RF PA circuit and substantially prevent a generation of unwanted oscillations.

Figure 8:
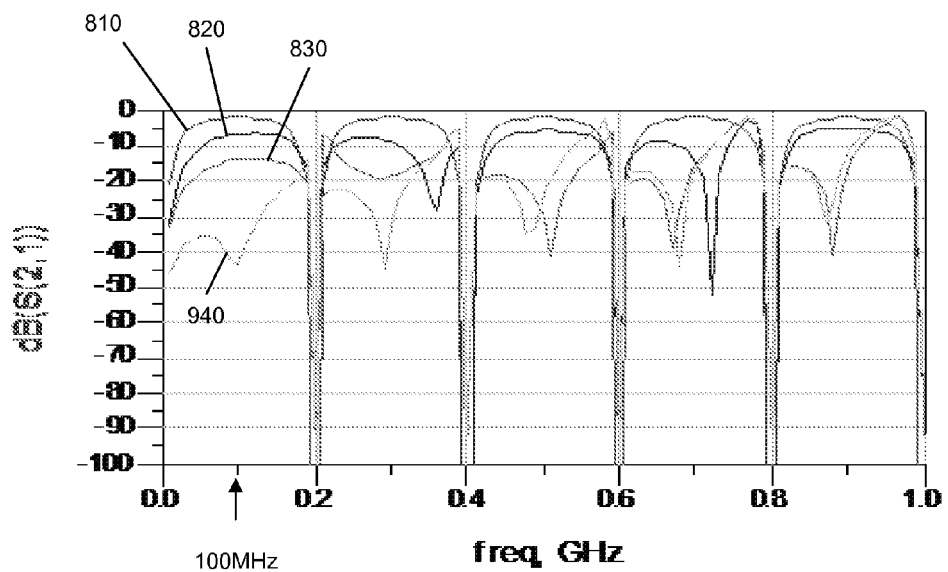
FIG. 8 illustrates examples of transfer functions for amplitude against frequency for the equivalent circuit of FIG. 7.

Referring now to FIG. 8, there are illustrated examples of transfer functions for amplitude against frequency for the output of the equivalent circuit 700 comprising various alternative stabilisation networks. A first curve 810 illustrates a transfer function for amplitude against frequency for the output of the equivalent circuit without a stabilisation network (for example as if the stabilisation network 780 of FIG. 7 was not present). A second curve 820 illustrates a transfer function for the equivalent circuit 700 with a stabilisation network comprising an inductance only, for example in a range of 1 nH-5 nH (which is typical of current wire bonding techniques), for example without capacitance 584 in FIGS. 5 and 6. A third curve 830 illustrates a transfer function for the equivalent circuit 700 with the stabilisation network 780 illustrated in FIG. 7 comprising a 200 pF capacitance. Finally, a fourth curve 840 illustrates a transfer function for the equivalent circuit 700 with the stabilisation network 780 of FIG. 7 comprising a 1 μF capacitance. As can be seen, the third and fourth curves 830, 840 illustrate a noticeable reduction in amplitude at particular frequencies. In particular, the fourth curve 840, representing the stabilisation network 780 comprising the 1 μF capacitance, shows a significant reduction in amplitude of signals at 100 MHz. Thus, by appropriate selection of the capacitive value for the stabilisation, network 780, a significantly improved stabilisation of differential noise at specific frequencies can be achieved, and in particular a significantly improved stabilisation, as compared with known stabilisation techniques.

As previously mentioned, the semiconductor package device 500 comprises at least one stabilisation network operably coupled between an output node of the first amplifier block 510 and a corresponding output node of the at least one further amplifier block 520. In particular, it is contemplated that the semiconductor package device 500 may comprise one or more stabilisation networks operably coupled between one or more output nodes of each respective amplifier block 510, 520, the one or more output nodes of each amplifier block 510, 520 may comprise one or more from a group of:
- an output of an active element of the respective amplifier block 510, 520;
- (ii) an input of an active element of the respective amplifier block;
- (iii) an electrode of a decoupling/matching capacitor within an input matching circuit of the respective amplifier block; and
- (iv) an electrode of a decoupling/matching capacitor within an output matching circuit of the respective amplifier block.

Figure 9:
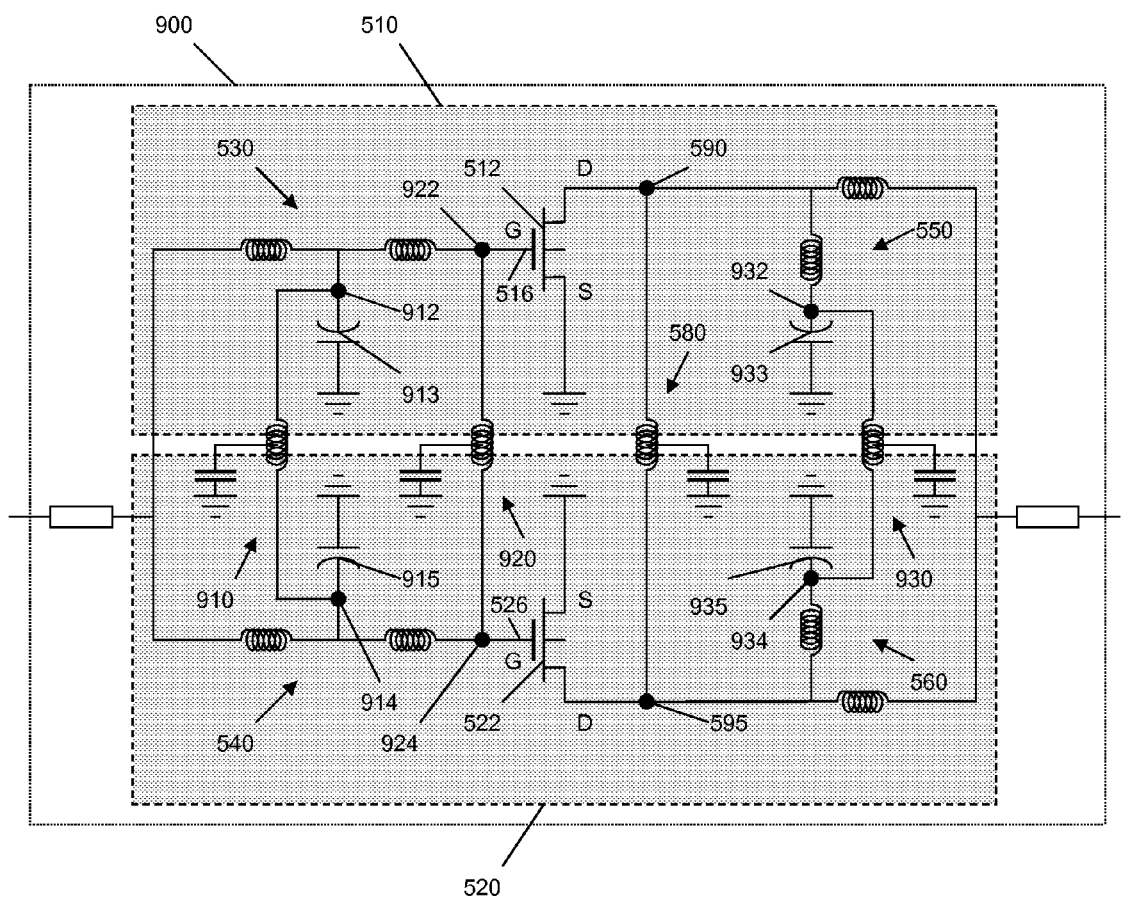
FIG. 9 illustrates a further example of a semiconductor package device.

Referring now to FIG. 9, there is illustrated an example of a further semiconductor package device 900. For the example illustrated in FIG. 9, the semiconductor package device 900 comprises the stabilisation network 580 previously mentioned and described with reference to FIG. 5. In particular, the stabilisation network 580 is operably coupled between nodes 590, 595 of the respective amplifier blocks 510, 520; the nodes 590, 595 comprising outputs of the active element of the respective amplifier blocks 510, 520, namely the drain ports 514, 524 of transistors 512, 522.

The semiconductor package device 900 of FIG. 9 further comprises additional/alternative stabilisation networks 910, 920, 930, operably coupled between additional/alternative nodes of the amplifier blocks 510, 520. For the illustrated example, stabilisation network 910 is operably coupled between nodes 912, 914; the nodes 912, 914 comprising electrodes of decoupling/matching capacitors 913, 915 within the input matching circuits 530, 540 of the respective amplifier blocks 510, 520. Stabilisation network 920 is operably coupled between input nodes 922, 924; the input nodes 922, 924 comprising inputs of the active element of the respective amplifier blocks 510, 520, namely the gates 516, 526 of transistors 512, 522. Stabilisation network 930 is operably coupled between output nodes 932, 934; the output nodes 932, 934 comprising electrodes of decoupling/matching capacitors 933, 935 within the output matching circuits 550, 560 of the respective amplifier blocks 510, 520.

As can be seen, each stabilisation network 580, 910, 920, 930 comprises an inductance operably coupled between the corresponding nodes of the first and second amplifier blocks 510, 520, and a capacitance operably coupling a mid-point of the inductance to a ground plane. It is contemplated that the semiconductor package device 900 according to this example may comprise any combination of one or more stabilisation networks 580, 910, 920, 930.

Thus, in this manner, each stabilization network is arranged to draw the odd mode currents, from different electrical points of parallel-configured transistors, to a ground point via interconnections with inductance and capacitance networks. In particular, it is noteworthy that the known techniques, such as that described in U.S. Pat. No. 6,281,756, propose a use of resistors. In the technical field of high power transistors, suitable resistors are difficult to manufacture. Furthermore, attempting to fix oscillations using such resistors would require a large set of resistors with different form factors and power capability. Furthermore resistors inherently provide broadband (as broad as can be) modifications of differential currents, with very limited attenuation and no phase change of the Transfer Function. Thus, they are unsuitable to solve the aforementioned differential mode current problem. In contrast the proposed use of reactive components provides a controllable and narrower bandwidth for noise cancellation. Furthermore, the proposed use of reactive components as described above provide a more aggressive modification of the differential mode currents and noise in amplitude over a specific frequency bandwidth, and thus provides a mean to additionally adjust the phase response.

As previously mentioned, the capacitance within each stabilisation network enables tuning of the respective stabilisation network to stabilise unwanted oscillations over a wide range of frequencies. In accordance with some alternative examples, the capacitance within a stabilisation network may be provided using a variable capacitor, such as voltage variable capacitor (VVC). In this manner, the frequency at which the stabilisation network provides the most effective stabilisation may be dynamically adjusted by tuning of the variable capacitor. Typically, the use of such a current variable capacitor may enable tuning of the stabilisation network over a relatively small frequency range. However, such fine tuning may enable dynamic tuning of the stabilisation circuit, for example, in order to compensate for the ageing of components etc. Nevertheless, in other examples, variable capacitors may additionally be tuned over greater ranges. In this manner, a stabilisation network may be suitable for a wider range of applications. In other circuit examples, alternative non-voltage capacitor tuning arrangements may be used.

It is within the contemplation of the invention that the improved circuit topology may operate with substantially all types of RF power transistor types, such as laterally diffused metal oxide semiconductors (LDMOS), bipolar transistors, gallium nitride (GaN), etc. It is also within the contemplation of the invention that improved circuit topology may operate with a variety of amplifier architectures, such as Doherty-based linear PA architectures, drain modulation architectures and switched amplification techniques.

In the foregoing specification, the invention has been described with reference to specific examples of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

As the apparatus implementing the invention is, for the most part, composed of electronic components and circuits known to those skilled in the art, circuit details will not be explained in any greater extent than that considered necessary as illustrated above, for the understanding and appreciation of the underlying concepts of the invention and in order not to obfuscate or distract from the teachings of the invention.

Although the invention has been described with respect to specific conductivity types or polarity of potentials, other conductivity types may be used and polarities of potentials may be reversed.

The description of the architecture has been simplified for purposes of discussion, and it is just one of many different types of appropriate architectures that may be used in accordance with the invention. Those skilled in the art will recognize that the boundaries between logic blocks are merely illustrative and that alternative examples may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled' to each other to achieve the desired functionality.

Furthermore, those skilled in the art will recognize that boundaries between the functionality of the above described operations merely illustrative. In addition, the devices may be physically distributed over a number of apparatuses, while functionally operating as a single device. For example, devices functionally forming separate devices may be integrated in a single physical device. However, other modifications, variations and alternatives are also possible. The specifications and drawings are, accordingly, to be regarded in an illustrative, rather than in a restrictive, sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. A mere fact that certain measures are recited in mutually different claims does not indicate that a combination of these measures cannot be used to advantage.

The invention claimed is:

1. A semiconductor package device comprising:
    a first amplifier block;
    at least one further amplifier block operably coupled in parallel with the first amplifier block between a common input and a common output such that signals present at the common input are able to follow a first path and at least one further path to the common output; and
    at least one stabilisation network operably coupled between a node of the first amplifier block and a corresponding node of the at least one further amplifier block, wherein
    the at least one stabilisation network comprises
        an inductance operably coupled between the corresponding nodes of the first amplifier block and the at least one further amplifier blocks, and
        a capacitance operably coupling a mid-point of the inductance to a ground plane such that the stabilisation network provides alternative paths for signals present at the nodes to the ground plane.

2. The semiconductor package device of claim 1 wherein the inductance of the at least one stabilisation network comprises:
    a first inductive element, operatively coupled between a node of the first amplifier block and the capacitance; and
    a second inductive element, operatively coupled between a node of the at least one further amplifier block and the capacitance.

3. The semiconductor package device of claim 1 wherein the capacitance of the at least one stabilisation network comprises a capacitive value in the range of 1 µF to 60 pF.

4. The semiconductor package device of claim 1 wherein the capacitance of the at least one stabilisation network comprises a variable capacitor.

5. The semiconductor package device of claim 1 wherein the capacitance of the at least one stabilisation network operably couples a mid-point of the inductance to a virtual ground plane.

6. The semiconductor package device of claim 1 wherein the node of each of the first and at the least one further amplifier block to which the at least one stabilisation network is operably coupled comprises at least one of:
    an output of an active element of the respective amplifier block;
    an input of an active element of the respective amplifier block;
    an electrode of a decoupling/matching capacitor within an input matching circuit of the respective amplifier block; and
    an electrode of a decoupling/matching capacitor within an output matching circuit of the respective amplifier block.

7. The semiconductor package device of claim 1 wherein each of the first and at least one further amplifier block comprises an active element in a form of a single ended power transistor.

8. The semiconductor package device of claim 7 wherein the single ended power transistor of each of the first amplifier block and the at least one further amplifier block comprises a common source terminal operably coupled to ground.

9. The semiconductor package device of claim 1 wherein the at least one further amplifier blocks comprises a plurality of further amplifier blocks.

10. The semiconductor package device of claim 1 wherein the first amplifier block and the at least one further amplifier block is formed on a separate die within the semiconductor package device.

11. A wireless communication device comprising a semiconductor package device comprising:
    a first amplifier block;
    at least one further amplifier block operably coupled in parallel with the first amplifier block between a common input and a common output such that signals present at the common input are able to follow a first path and at least one further path to the common output; and at least one stabilisation network operably coupled between a node of the first amplifier block and a corresponding node of the at least one further amplifier block, wherein
the at least one stabilisation network comprises an inductance operably coupled between the corresponding nodes of the first amplifier block and the at least one further amplifier block, and
a capacitance operably coupling a mid-point of the inductance to a ground plane such that the stabilisation network provides alternative paths for signals present at the nodes to the ground plane.

12. The wireless communication device of claim 11 wherein the inductance of the at least one stabilisation network comprises:
a first inductive element, operatively coupled between a node of the first amplifier block and the capacitance; and
a second inductive element, operatively coupled between a node of the at least one further amplifier block and the capacitance.

13. The wireless communication device of claim 11 wherein the capacitance of the at least one stabilisation network comprises a variable capacitor.

14. The wireless communication device of claim 11 wherein the capacitance of the at least one stabilisation network operably couples a mid-point of the inductance to a virtual ground plane.

15. The wireless communication device of claim 11 wherein the node of each of the first amplifier block and the at least one further amplifier block to which the at least one stabilisation network is operably coupled comprises at least one of:
an output of an active element of the respective amplifier block;
an input of an active element of the respective amplifier block;
an electrode of a decoupling/matching capacitor within an input matching circuit of the respective amplifier block; and
an electrode of a decoupling/matching capacitor within an output matching circuit of the respective amplifier block.

16. The wireless communication device of claim 11 wherein each of the first amplifier block and the at least one further amplifier block comprises an active element in a form of a single ended power transistor.

17. The wireless communication device of claim 16 wherein the single ended power transistor of each of the first amplifier block and the at least one further amplifier blocks comprises a common source terminal operably coupled to ground.

18. The wireless communication device of claim 11 wherein the at least one further amplifier block comprises a plurality of further amplifier blocks.

19. The wireless communication device of claim 11 wherein the first amplifier block and the at least one further amplifier block is formed on a separate die within the semiconductor package device.

20. The wireless communication device of claim 11 wherein the capacitance of the at least one stabilisation network comprises a capacitive value in the range of 1 µF to 60 pF.

* * * * *